United States Patent
Li et al.

(10) Patent No.: US 7,652,886 B2
(45) Date of Patent: Jan. 26, 2010

(54) HEAT SINK ASSEMBLY HAVING A FASTENER ASSEMBLY FOR FASTENING THE HEAT SINK TO AN ELECTRONIC COMPONENT

(75) Inventors: Min Li, Shenzhen (CN); Lei Cao, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 234 days.

(21) Appl. No.: 11/831,934

(22) Filed: Jul. 31, 2007

(65) Prior Publication Data

US 2009/0034200 A1 Feb. 5, 2009

(51) Int. Cl.
*H05K 7/20* (2006.01)
*H01L 23/34* (2006.01)
*A41F 1/00* (2006.01)
*A47B 97/00* (2006.01)
*B65D 45/32* (2006.01)
*F16B 13/06* (2006.01)

(52) U.S. Cl. .................. 361/719; 361/709; 361/710; 257/718; 257/719; 165/80.3; 24/458; 24/459; 24/520; 248/510; 292/257; 411/41; 411/45; 411/55; 411/518

(58) Field of Classification Search ............... 361/704, 361/709, 710, 718, 719; 257/718–719; 165/80.2, 165/80.3, 185; 24/458, 459, 520; 248/510; 292/251, 257; 411/508, 511, 518, 45, 41, 411/55, 340, 344, 345
See application file for complete search history.

(56) References Cited

U.S. PATENT DOCUMENTS 2,404,169 A * 7/1946 Gidden .................. 411/340
4,764,065 A * 8/1988 Johnson ................. 411/21
6,307,748 B1 * 10/2001 Lin et al. ............... 361/704

FOREIGN PATENT DOCUMENTS

CN 1937899 A 3/2007

* cited by examiner

*Primary Examiner*—Zachary M Pape
(74) *Attorney, Agent, or Firm*—Frank R. Niranjan

(57) ABSTRACT

A heat sink assembly for dissipating heat from an electronic component (12) mounted on a printed circuit board (10) includes a heat sink (20) resting on the electronic component, and a fastener assembly (30) for securing the heat sink to the electronic component. The fastener assembly includes a hollow post (36) having a threaded hole (360) defined therein, a screw (32) threadedly engaged in the threaded hole, a coil spring (34) compressibly disposed between the heat sink and a top portion of the screw, and a latch (38) pivotably engaging with a bottom portion of the post. When the screw moves downwardly towards the printed circuit board, the latch is pushed by the screw to rotate and press the heat sink towards the printed circuit board, thus securing the heat sink to the electronic component.

14 Claims, 7 Drawing Sheets

HEAT SINK ASSEMBLY HAVING A FASTENER ASSEMBLY FOR FASTENING THE HEAT SINK TO AN ELECTRONIC COMPONENT

BACKGROUND OF THE INVENTION

1. Field of the Invention

The present invention relates to a heat sink assembly, and more particularly to a heat sink assembly having a heat sink and a fastener assembly which can conveniently and reliably attach the heat sink to an electronic device.

2. Description of Related Art

A heat sink is usually placed in thermal contact with an electronic package such as a central processing unit (CPU), and transfers heat through conduction away from the electronic package so as to prevent over-heating of the electronic package. Usually, a heat sink is secured to an electronic package by using clips. Nevertheless, the clips are difficult to assemble, and the force exerted by the clips to the heat sink is difficult to control.

On the other hand, a printed circuit board with an electronic component mounted thereon has four holes defined around the electronic component, and a heat sink has four through holes defined in four corners thereof corresponding to the four holes of the printed circuit board. Screws extend through the through holes of the heat sink and the holes of the printed circuit board, and engage in the holes of a back plate attached to a bottom face of the printed circuit board, thereby attaching the heat sink to the electronic component. However, the heat sink is rigidly connected to the electronic component. It is difficult to ensure that the heat sink applies a uniform pressure on the electronic component, thus tending to reduce the efficiency of heat dissipation. Furthermore, the printed circuit board is prone to be deformed due to a rigid connection with the heat sink. Finally, to add the back plate in order to fasten the heat sink to the printed circuit board is costly.

What is needed, therefore, is an improved heat sink assembly which can overcome the above problems.

SUMMARY OF THE INVENTION

A heat sink assembly is for dissipating heat from an electronic component mounted on a printed circuit board, the heat sink assembly includes a heat sink resting on the electronic component, and a fastener assembly for securing the heat sink to the electronic component. The fastener assembly includes a hollow post having a threaded hole defined therein, a screw threadedly engaged in the through hole, a coil spring compressibly disposed between the heat sink and a top portion of the screw, and a latch pivotably connected with a bottom portion of the post. When the screw moves downwardly towards the printed circuit board and pushes the heat sink towards the printed circuit board via the coil spring, the latch is pushed by the screw to rotate from a vertical orientation. When the latch is pushed to rotate to a horizontal orientation and engages a bottom face of the printed circuit board, the heat sink is secured to the electronic component. To release the secure attachment of the heat sink from the electronic component, the screw is rotated reversely until the latch is pivoted to return to its vertical orientation.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
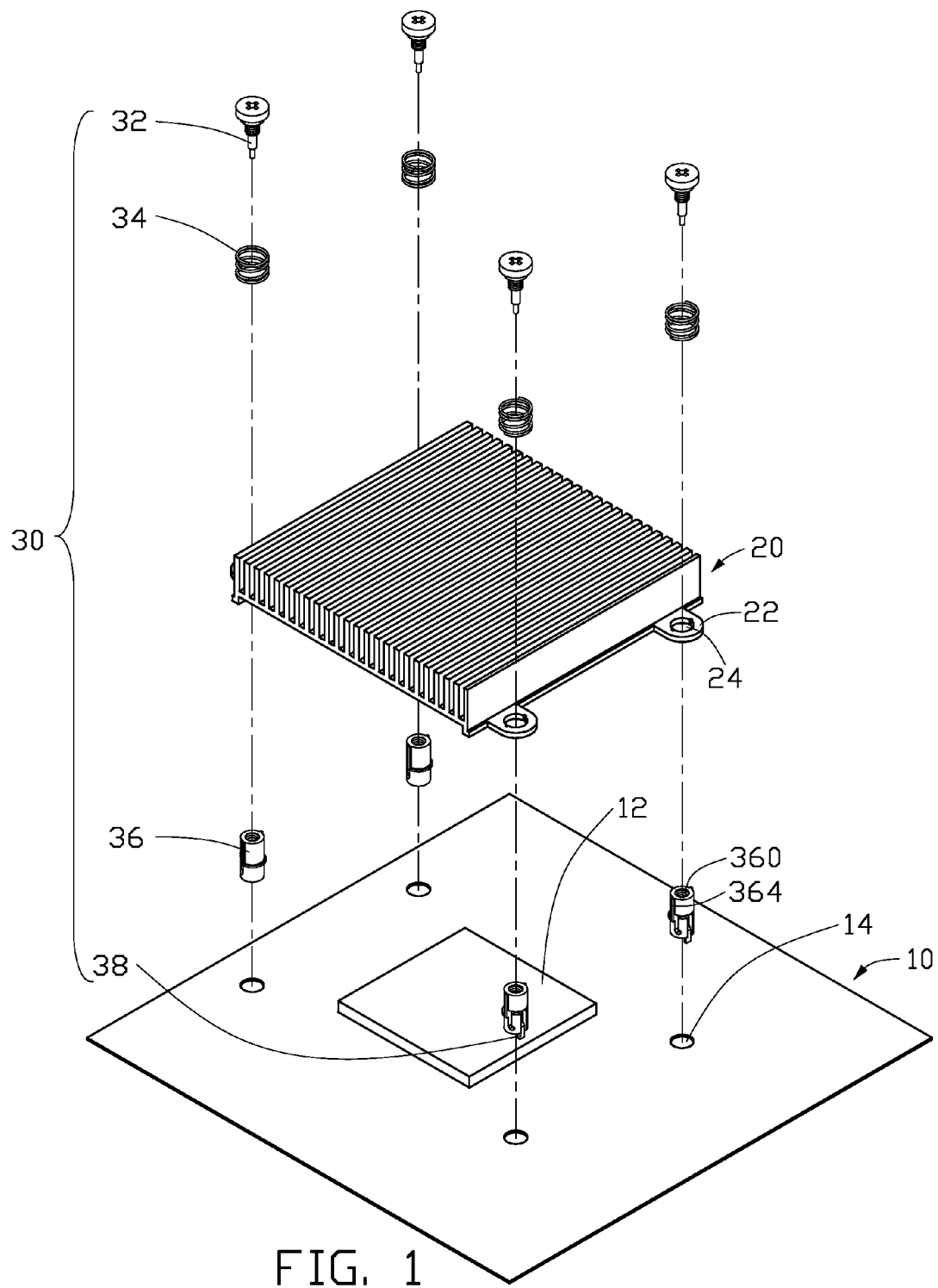
FIG. 1 is an exploded, isometric view of a heat sink assembly with a printed circuit board having an electronic component mounted thereon in accordance with a preferred embodiment of the present invention.
Figure 2:
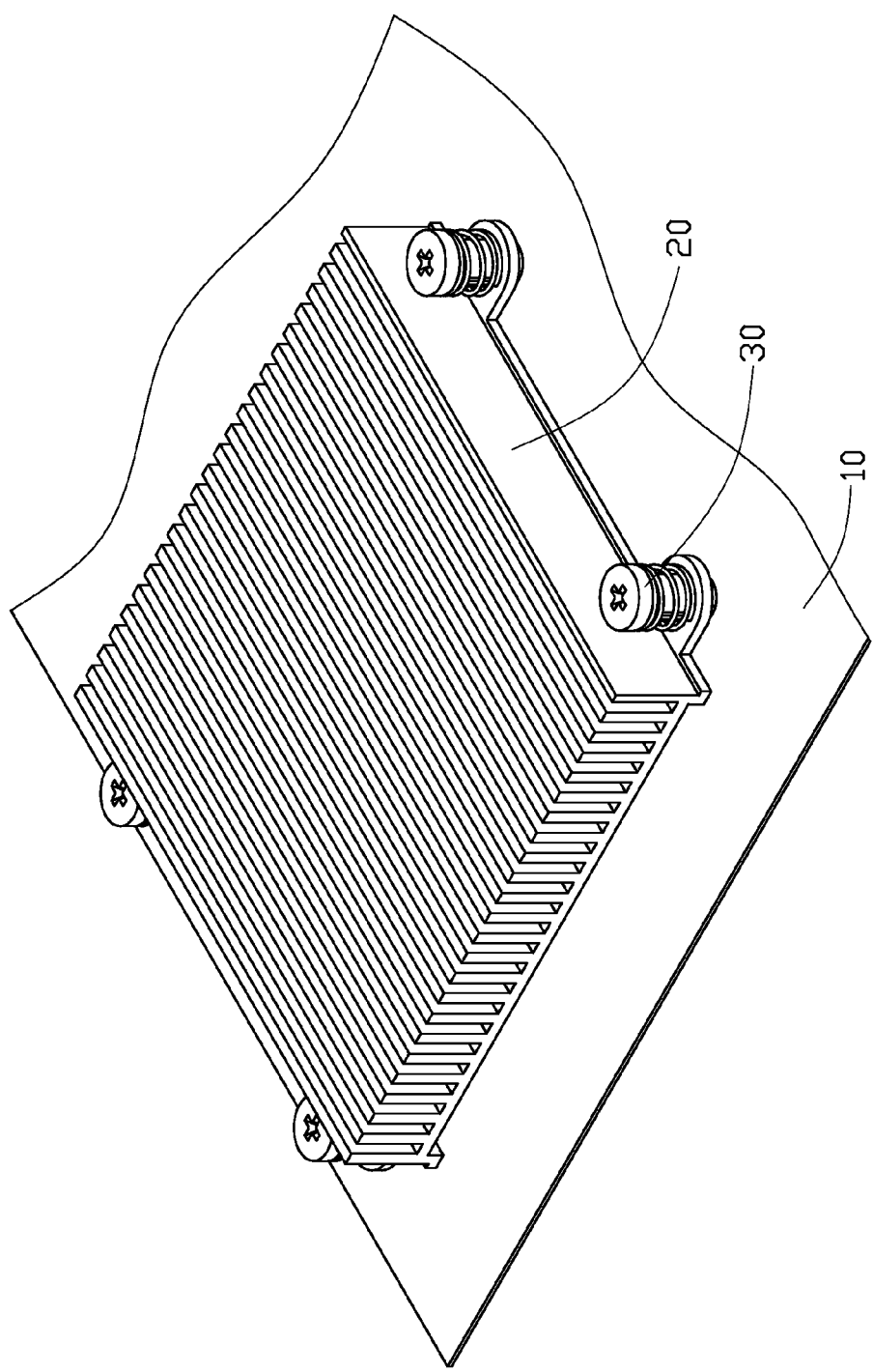
FIG. 2 is an assembled view of FIG. 1.

Referring to FIGS. 1-2, a heat sink assembly in accordance with a preferred embodiment of the invention is used for dissipating heat from an electronic component 12 mounted on a printed circuit board 10. The printed circuit board 10 defines four through holes 14 therein, located near four corners of the electronic component 12. The heat sink assembly comprises a heat sink 20 and four fastener assemblies 30.

The heat sink 20 comprises a base (not labeled) that has a bottom face for contacting the electronic component 12, and a plurality of fins (not labeled) extending upwardly and perpendicularly from a top face (not labeled) of the base. Four locking ears 22 extend outwardly and horizontally from four corners of the base. Each ear 22 defines a circular through hole 24 in a central area thereof and a pair of opposite rectangular apertures (not labeled) in a periphery of the through hole 24.

The fastener assembly 30 comprises a post 36 made of metal or plastic, a screw 32 for being threadedly attached to the post 36, a coil spring 34 for being mounted around the post 36 and compressed between the screw 32 and the ear 22, and a latch 38 for being pivotably connected with the post 36.

Figure 3:
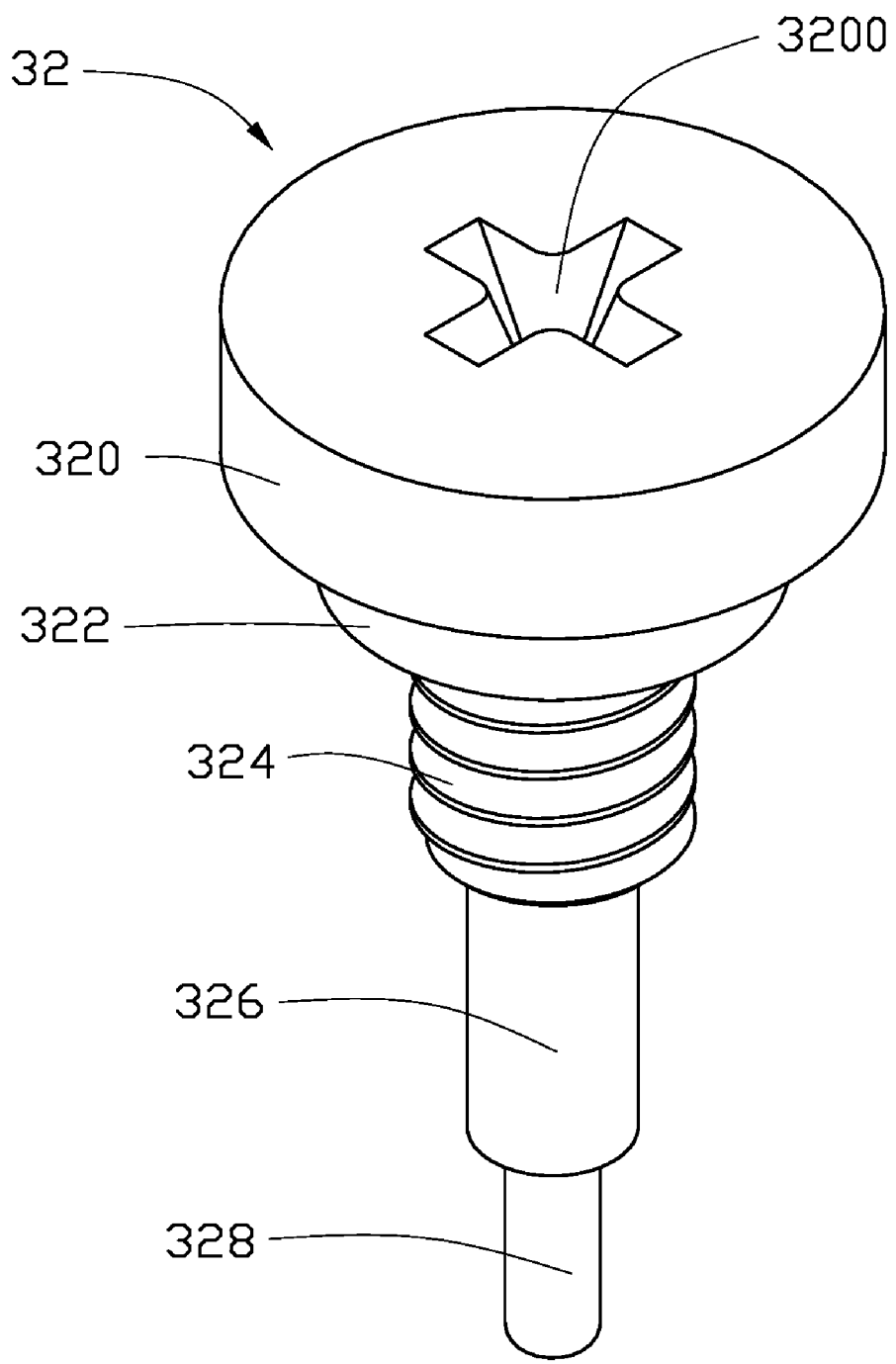
FIG. 3 is an enlarged view of a screw of FIG. 1.

As shown in FIG. 3, the screw 32 comprises an expanding head 320, a neck 322 adjacent to and below the head 320, a threaded portion 324 next to and below the neck 322, a connecting portion 326 beneath the threaded portion 324, and a pressing portion 328 at a lower end of the screw 32 opposing to the head 320. The head 320, the neck 322, the threaded portion 324, the connecting portion 326, and the pressing portion 328 have gradually decreasing diameters. A cross recess 3200 is defined in a top face of the head 320 for facilitating a tool (not shown) such as a screwdriver to operate the screw 32.

Referring to FIG. 1 again, the spring 34 is for being disposed on the ear 22 of the heat sink 20. The spring 34 defines a hole which is larger than an outer diameter of the post 36 so that the spring 34 can enclose the post 36 therein. Furthermore, the hole of the spring 34 is smaller than an outer diameter of the head 320 of the screw 32, so that the spring 34 can be compressed between the head 320 of the screw 32 and the ear 22 of the heat sink 20.

Figure 4:
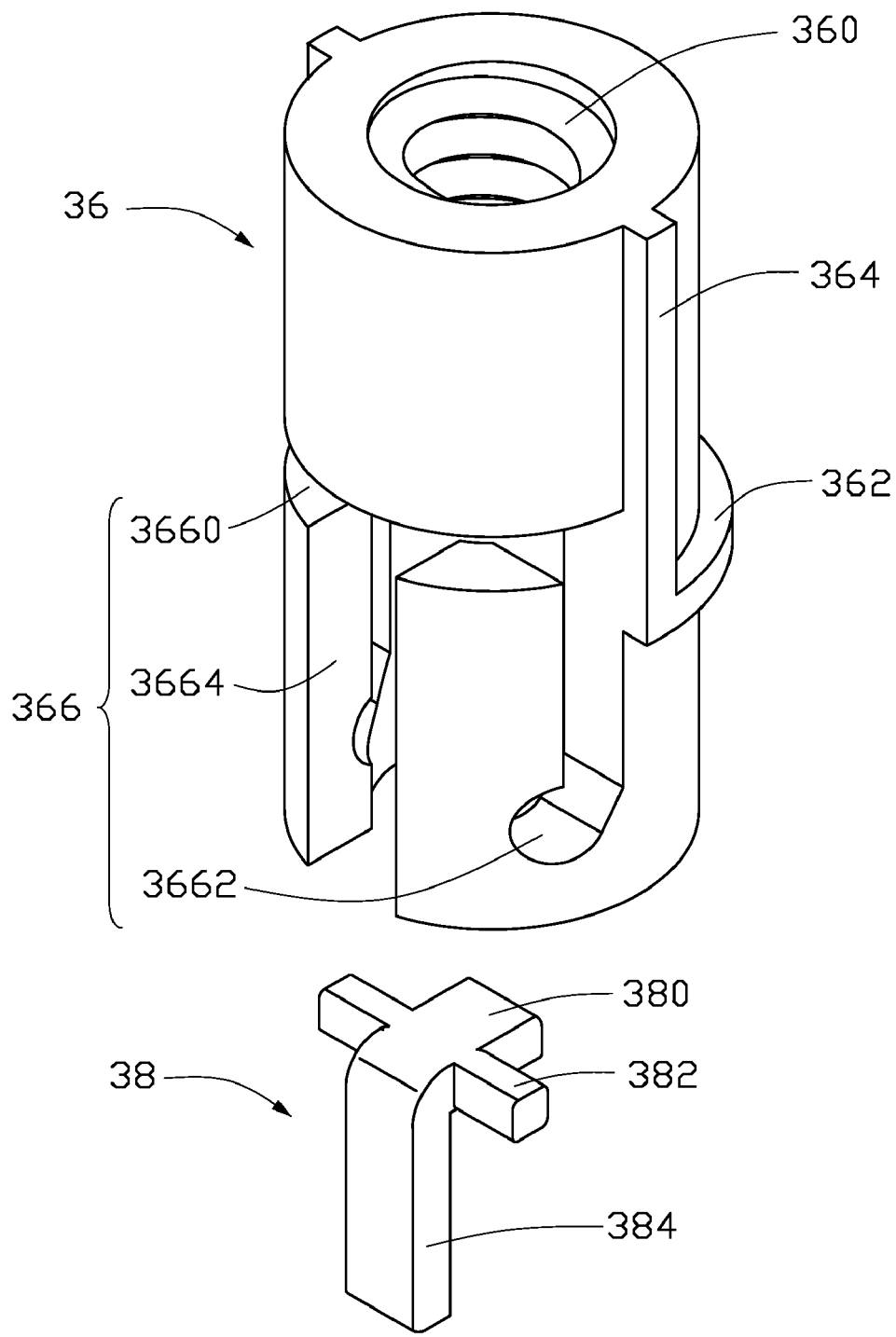
FIG. 4 is an enlarged, exploded view of a post and a latch of FIG. 1.
Figure 5:
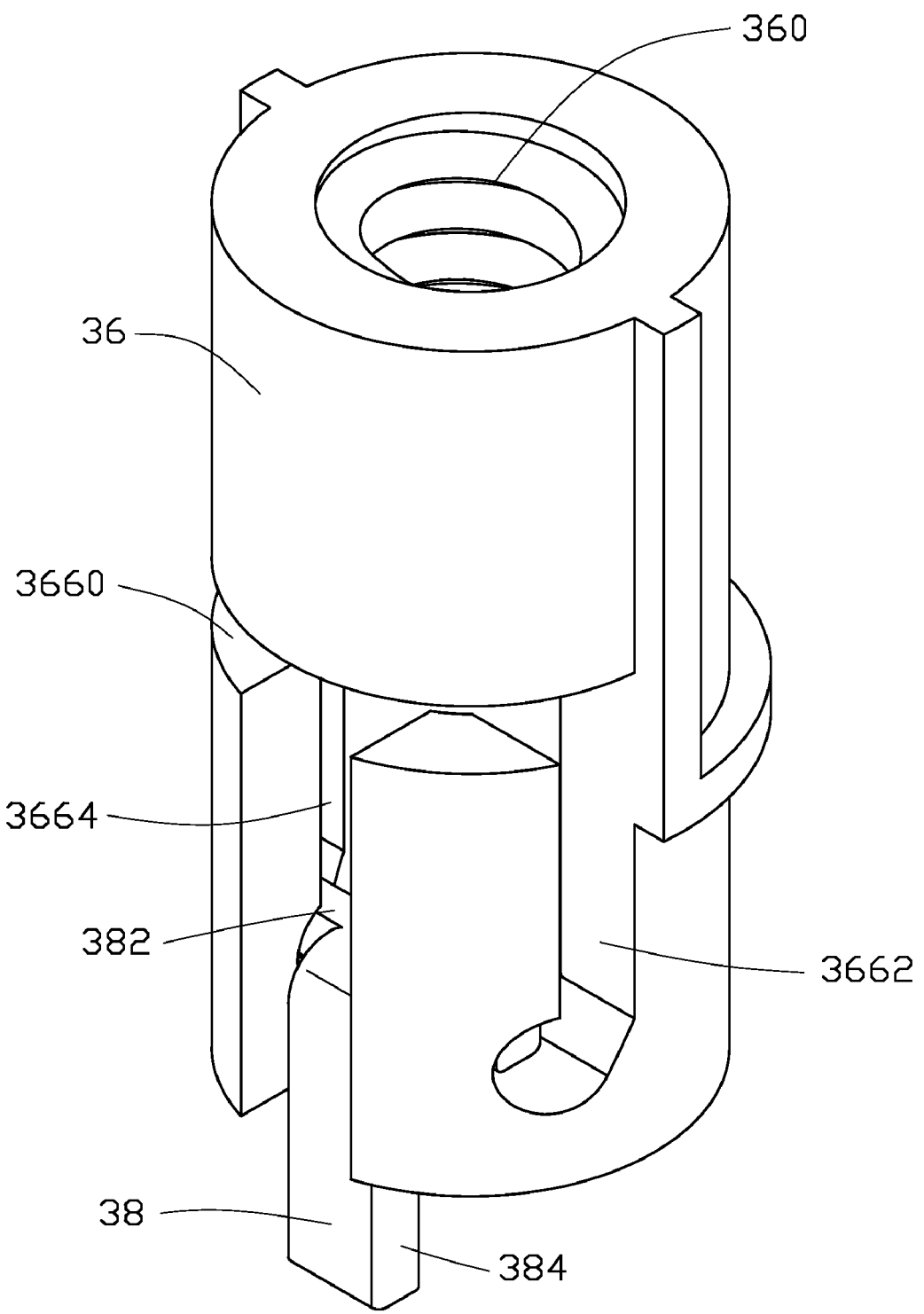
FIG. 5 is an assembled view of FIG. 4.

Referring to FIGS. 4 and 5, the post 36 comprises a hollow cylindrical body (not labeled). A threaded hole 360 is defined through an upper half of the body of the post 36. The threaded hole 360 is used for threadedly receiving the threaded portion 324 of the screw 32. A semi-annular pad 362 is formed perpendicularly and horizontally from an outer side of the body at a middle of a height of the post 36. A pair of opposite shoulders 364 extend vertically and outwardly from the outer side of the body in a manner such that each shoulder 364 has a bottom end connects a corresponding end of the pad 362, and a top end being coplanar with a top face of the body of the post 36. Each shoulder 364 has a rectangular cross section corresponding to the aperture of the heat sink 20 for preventing the post 36 from being rotated when the post 36 is mounted in the through hole 24 of a corresponding locking ear 22. The body defines a cutout 366 in the outer side thereof, through a lower half of the post 36, wherein the cutout 366 communicates with an inner space (not labeled) of the lower half of the post 36, which is just below and communicates with the threaded hole 360 of the post 36. The cutout 366 comprises a semi-annular first notch 3660 opposing the pad 362, a pair of second notches 3662 and a third notch 3664. The first notch 3660 is located higher than the pad 362 and between the two shoulders 364 of the post 36 with two ends of the first notch 3660 adjacent to corresponding lateral sides of the shoulders 364. The pair of second notches 3662 extend downwardly from the two ends of the first notch 3660 in such a manner that each second notch 3662 comprises an elongated section (not labeled) perpendicularly communicating with the first notch 3660, and an arced section (not labeled) communicating a lower end of the elongated section. The arced section is located a distance above a bottom face of the body of the post 36. The third notch 3664 extends downwardly and vertically from a middle of the first notch 3660 to the bottom face of the body and between the second notches 3662.

The latch 38 is formed by bending a piece of metal having a shape similar to a Latin Cross. The latch 38 comprises an abutting section 380, an engaging section 384 extending perpendicularly and downwardly from a bottom of the abutting section 380, and a pair of arms 382 formed vertically and outwardly from two lateral sides of the abutting section 380. The engaging section 384 has a cross section identical to that of the abutting section 380, which has a cross sectional area larger than that of the arms 382.

Particularly referring to FIG. 5, in assembly of the latch 38 and the post 36, the arms 382 and the abutting section 380 of the latch 38 are brought to extend through the first notch 3660 of the post 36 with the engaging section 384 of the latch 38 passing through the third notch 3664 of the post 36; then the arms 382 are brought to move downwardly along the elongated sections of the second notches 3662 to reach the arced sections of the second notches 3662. The latch 38 is partly received in the post 36 in a manner such that the abutting section 380 of the latch 38 is substantially accommodated in the inner space of the lower half of the post 36, a lower portion of the engaging section 384 of the latch 38 is exposed out of the post 36, and the arms 382 of the latch 38 are pivotably engaged in the arced sections of the second notches 3662 of the post 36, whereby the latch 38 is rotatable around the arms 382.

Figure 6:
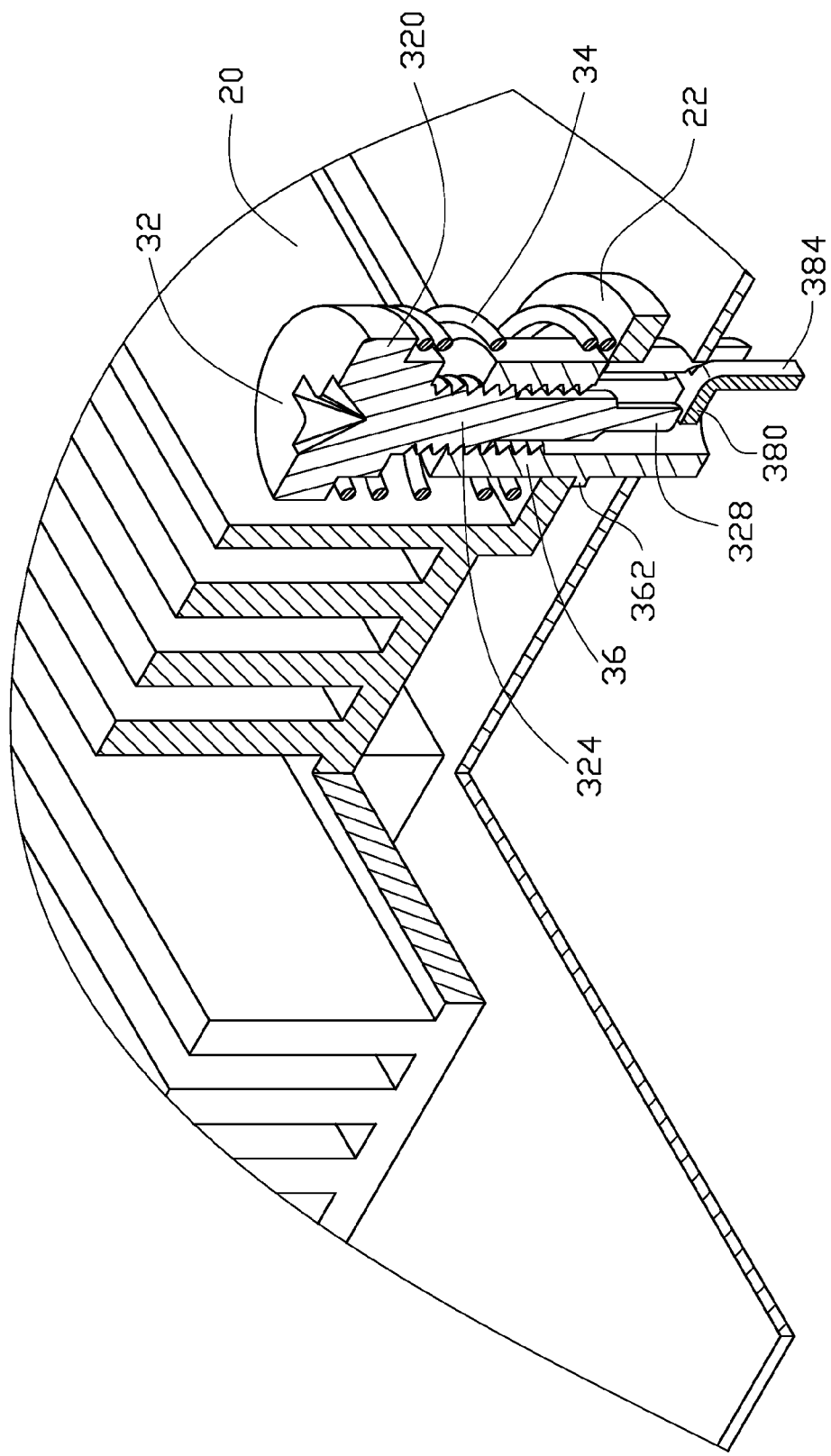
FIG. 6 is an enlarged, partially cross-sectional view of a portion of FIG. 2 of with the latch in a released position.

As shown in FIGS. 1 and 6, in assembly of the heat sink assembly, the heat sink 20 is disposed on the electronic component 12 with the four through holes 24 of the heat sink 20 in line with the through holes 14 of the printed circuit board 10. A combination of the latch 38 and the post 36 extends through the through holes 14, 24 of the printed circuit board 10 and the heat sink 20 from a bottom of the printed circuit board 10 in a manner such that the shoulders 364 of the post 36 fit in corresponding apertures of the ear 22, and a top face of the pad 362 abuts against a bottom face of the ear 22 of the heat sink 20 for allowing the engaging section 384 of the latch 38 to project downwardly out of the printed circuit board 10. The spring 34 rests on a top face of the ear 22 of the heat sink 20 with the upper half of the post 36 being enclosed by the spring 34. The screw 32 is then brought to insert downwardly into the threaded hole 360 of the post 36 with the pressing portion 328 and the connecting portion 326 passing through the threaded hole 360 and the threaded portion 324 engaging with the threaded hole 360. The head 320 of the screw 32 and the ear 22 of the heat sink 20 sandwich the spring 34 therebetween, the threaded portion 324 of the screw 32 threadedly engages with the thread hole 360 of the post 36, and the pressing portion 328 of the screw 32 is located above the abutting section 380 of the latch 38.

Figure 7:
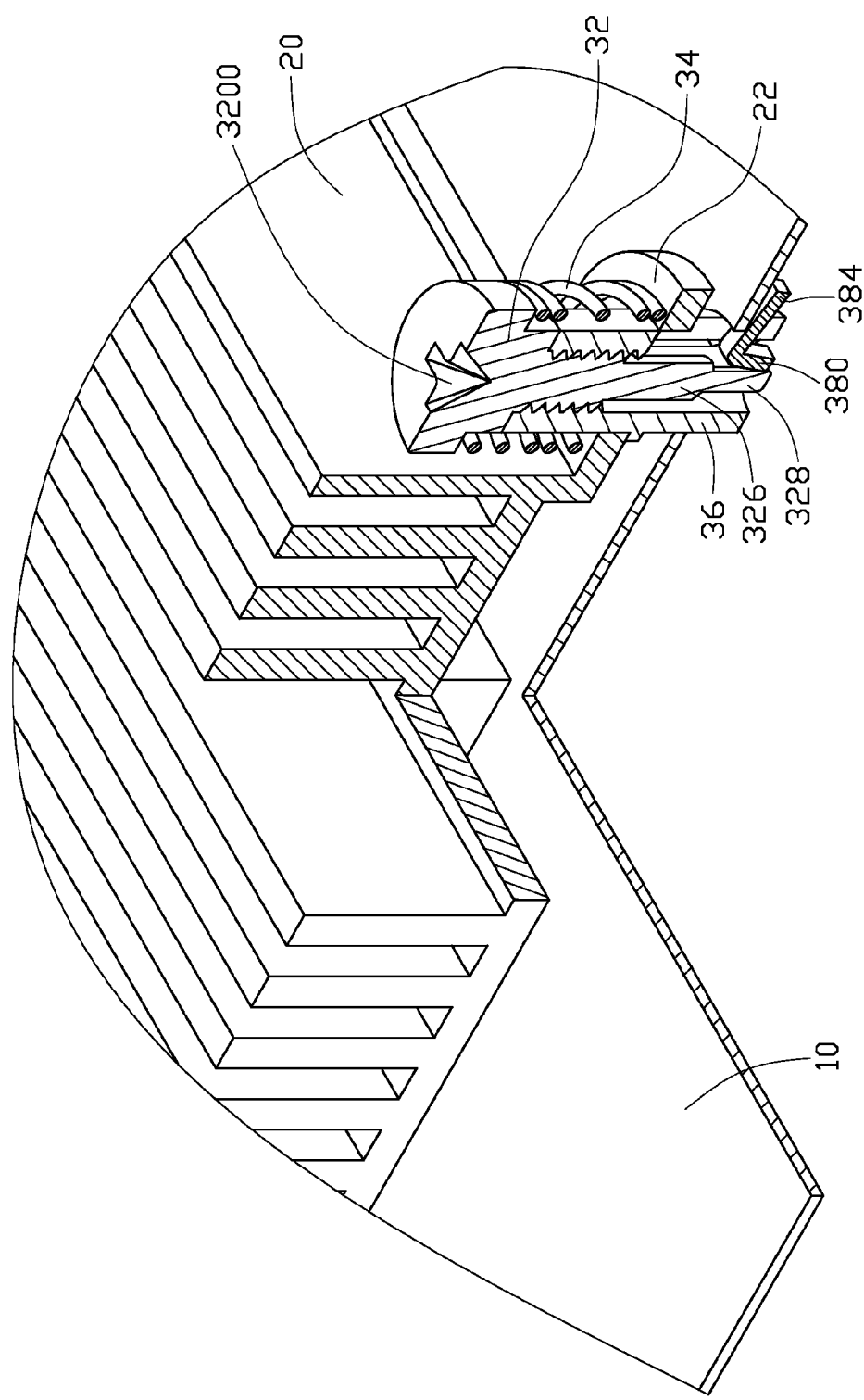
FIG. 7 is a view similar to FIG. 6 with the latch in a locked position.

Also referring to FIG. 7, in use, the tool is engaged in the recess 3200 of the screw 32 for manipulating the screw 32. The screw 32 is rotated to move downwardly in a manner such that the spring 34 is compressed to resiliently press the ear 22 of the heat sink 20 and accordingly the heat sink 20 towards the printed circuit board 10, and the pressing portion 328 of the screw 32 moves downwardly to push downwardly the abutting section 380 of the latch 38. As the downward movement of the screw 32 continues, the engaging section 384 of the latch 38 is activated by the pressing portion 328 to rotate upwardly around the arms 382 and through the third slot 3664 of the post 36; when the screw 32 is screwed into the threaded hole 360 of the post 36 to reach a locked position of FIG. 7, the engaging section 384 is rotated to a horizontal orientation and presses upon a bottom of the printed circuit board 10 towards the heat sink 20. Meanwhile the abutting section 380 is pushed by the pressing portion 324 to rotate downwardly. At the locked position, the abutting section 380 of the latch 38 is sandwiched between the pressing portion 328 of the screw 32 and the inner side of the post 36, and the engaging section 384 of the latch 38 abuts upwardly against the bottom face of the printed circuit board 10, thus securing the heat sink 20 to the printed circuit board 10 and enabling the heat sink 20 to have an intimate contact with the electronic component 12. To release the locking, one only needs to rotate the screw 32 reversely until the engaging portion 384 returns to its original vertical orientation as shown in FIG. 6.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly for dissipating heat generated by an electronic component mounted on a printed circuit board, comprising:

a heat sink mounted on the electronic component;

a pair of fastener assemblies securing the heat sink to the printed circuit board, each of the pair of fastener assemblies comprising:

a post defining a threaded hole therein, the post extending through the heat sink and the printed circuit board;

a screw being threadedly engaged in the threaded hole of the post;

a coil spring being resiliently sandwiched between the screw and the heat sink; and a latch pivotably engaging with the post, wherein when the screw moves towards the printed circuit board, the latch is driven by the screw to rotate for pressing the printed circuit board towards the heat sink;

wherein a cutout is defined in a lower portion of the post at a lateral side of the post and communicates with an inner space of the lower portion of the post, which is just below and communicates with the threaded hole; and wherein the cutout comprises a first slot, a pair of second slots extending downwardly from two ends of the first slot, and a third slot extending downwardly from the first slot between the pair of second slots.

2. The heat sink assembly as claimed in claim 1, wherein a pair of opposite shoulders are formed on an outer side of the post at an upper portion of the post, the shoulders being fitted in the heat sink for preventing the post from being rotated.

3. The heat sink assembly as claimed in claim 2, wherein a pad extends from the outer side at a middle of a height of the post for abutting against a bottom of the heat sink.

4. The heat sink assembly as claimed in claim 3, wherein the pad is located around the post at an opposite lateral side of the post and connects corresponding ends of the pair of opposite shoulders of the post.

5. The heat sink assembly as claimed in claim 1, wherein the latch comprises an abutting section, a pair of arms extending outwardly from two opposite lateral sides of the abutting section, and an engaging section bent from a bottom of the abutting section.

6. The heat sink assembly as claimed in claim 5, wherein the abutting section of the latch is received in the inner space of the lower portion of the post for abutting against the screw, the arms are pivotably engaged in corresponding second slots of the cutout of the post, and the engaging section is for being rotated through the third slot of the cutout of the post.

7. The heat sink assembly as claimed in claim 6, wherein the screw comprises a head for pressing the coil spring, a threaded portion for threadedly engagement with the post, and a pressing portion at an end opposing to the head thereof, the pressing portion being for driving the latch to rotate, the threaded portion being located between the head and the pressing portion.

8. The heat sink assembly as claimed in claim 7, wherein the pressing portion of the screw abuts against the abutting section of the latch, and when the screw is rotated downwardly toward printed circuit board, the pressing portion pushes downwardly the abutting section of the latch in a manner such that the engaging section of the latch is driven by the abutting section of the latch to rotate, to press the printed circuit board upwardly towards the heat sink.

9. The heat sink assembly as claimed in claim 7, wherein the coil spring encloses the post and is located between the head of the screw and the heat sink for pressing resiliently the heat sink towards the printed circuit board.

10. A fastener assembly adapted for mounting a heat sink to a printed circuit board, the fastener assembly comprising:

a cylindrical post defining a threaded hole in an upper portion thereof, and a cutout in a lower portion thereof;

a screw being threadedly engaged in the threaded hole of the post, the screw comprising a head, a pressing portion below the head, and a threaded portion between the head and the pressing portion, the threaded portion threadedly engaging in the threaded hole;

a coil spring enclosing the post and adapted for being compressibly sandwiched between the head of the screw and the heat sink;

a latch comprising:

an abutting section for engagement with the pressing portion of the screw;

a pair of arms being pivotably engaged in the cutout of the post; and an engaging section, wherein when the screw is rotated to move downwardly towards the latch, the abutting section of the latch is pushed downwardly by the pressing portion of the screw to cause the engaging section of the latch to rotate upwardly around the arms of the latch, the upwardly rotating engaging section of the latch being adapted for pressing the printed circuit board towards the heat sink;

wherein the cutout of the post comprises a first slot, a pair of second slots extending downwardly from two ends of the first slot, and a third slot defined downwardly from the first slot between the pair of second slots.

11. The fastener assembly as claimed in claim 10, wherein the post further comprises a semi-annular pad therearound, and a pair of opposite shoulders extending from an outer side thereof in a manner such that the pair of opposite shoulders connect with the pad.

12. The fastener assembly as claimed in claim 10, wherein the pair of arms extend from two lateral sides of the abutting section of the latch, and the engaging section is bent from a bottom portion of the abutting section of the latch.

13. The fastener assembly as claimed in claim 12, wherein the first slot of the cutout has a semi-annular configuration, each of the pair of second slots comprises an elongated portion extending downwardly from the first slot and an arced portion located at a bottom of and communicating with the elongated portion, and the arms of the latch are pivotably received in the arced portions of the second slots, respectively.

14. The fastener assembly as claimed in claim 13, wherein the abutting section of the latch is received in an inner space of the lower portion of the post, which is just below and communicates with the threaded hole of the post, and the engaging section of the latch is rotatable through the third slot of the cutout of the latch.

\* \* \* \* \*